(12) United States Patent
Pan et al.

(10) Patent No.: US 12,519,059 B2
(45) Date of Patent: Jan. 6, 2026

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Tseng-Chieh Pan, New Taipei (TW); Yu-Hsiang Wang, Miaoli County (TW); Chi-Shin Wang, Hsinchu (TW); Fan-Yi Hsu, Miaoli County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 262 days.

(21) Appl. No.: 18/152,134

(22) Filed: Jan. 9, 2023

(65) Prior Publication Data
US 2024/0088041 A1    Mar. 14, 2024

Related U.S. Application Data

(60) Provisional application No. 63/374,951, filed on Sep. 8, 2022.

(51) Int. Cl.
*H01L 23/532* (2006.01)
*H01L 21/02* (2006.01)
*H01L 21/3213* (2006.01)
*H01L 21/324* (2006.01)

(52) U.S. Cl.
CPC .. *H01L 23/53266* (2013.01); *H01L 21/02068* (2013.01); *H01L 21/02362* (2013.01); *H01L 21/32135* (2013.01); *H01L 21/324* (2013.01)

(58) Field of Classification Search
CPC ......... H01L 23/53266; H01L 21/02068; H01L 21/02362; H01L 21/32135; H01L 21/324; H01L 21/28176
See application file for complete search history.

(56) References Cited

U.S. PATENT DOCUMENTS

| | | | |
|---|---|---|---|
| 9,076,766 B2* | 7/2015 | Liu | H01L 29/40114 |
| 9,614,089 B2* | 4/2017 | Chang | H10D 64/511 |
| 2008/0156349 A1* | 7/2008 | Kim | C11D 7/08 |
| | | | 134/3 |
| 2017/0278969 A1* | 9/2017 | Adusumilli | H01L 21/2855 |

* cited by examiner

*Primary Examiner* — Dale E Page
*Assistant Examiner* — Quovaunda Jefferson
(74) *Attorney, Agent, or Firm* — WPAT LAW; Anthony King

(57) ABSTRACT

The present disclosure provides a semiconductor structure, including a substrate, a gate structure over the substrate, including a work function layer over the substrate, a dielectric layer at least partially surrounding the gate structure, and a capping layer over the gate structure, wherein a bottom of the capping layer includes at least one protrusion protruding toward the substrate.

20 Claims, 10 Drawing Sheets

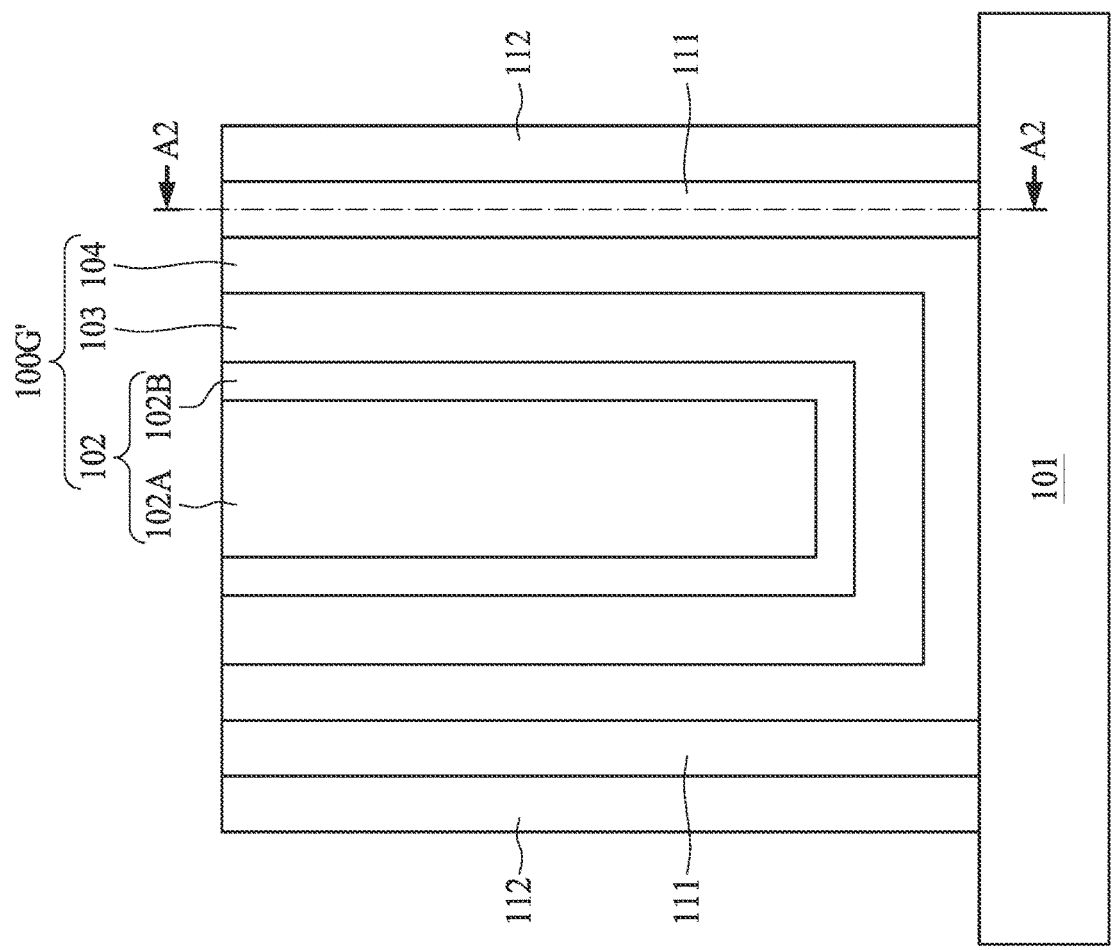

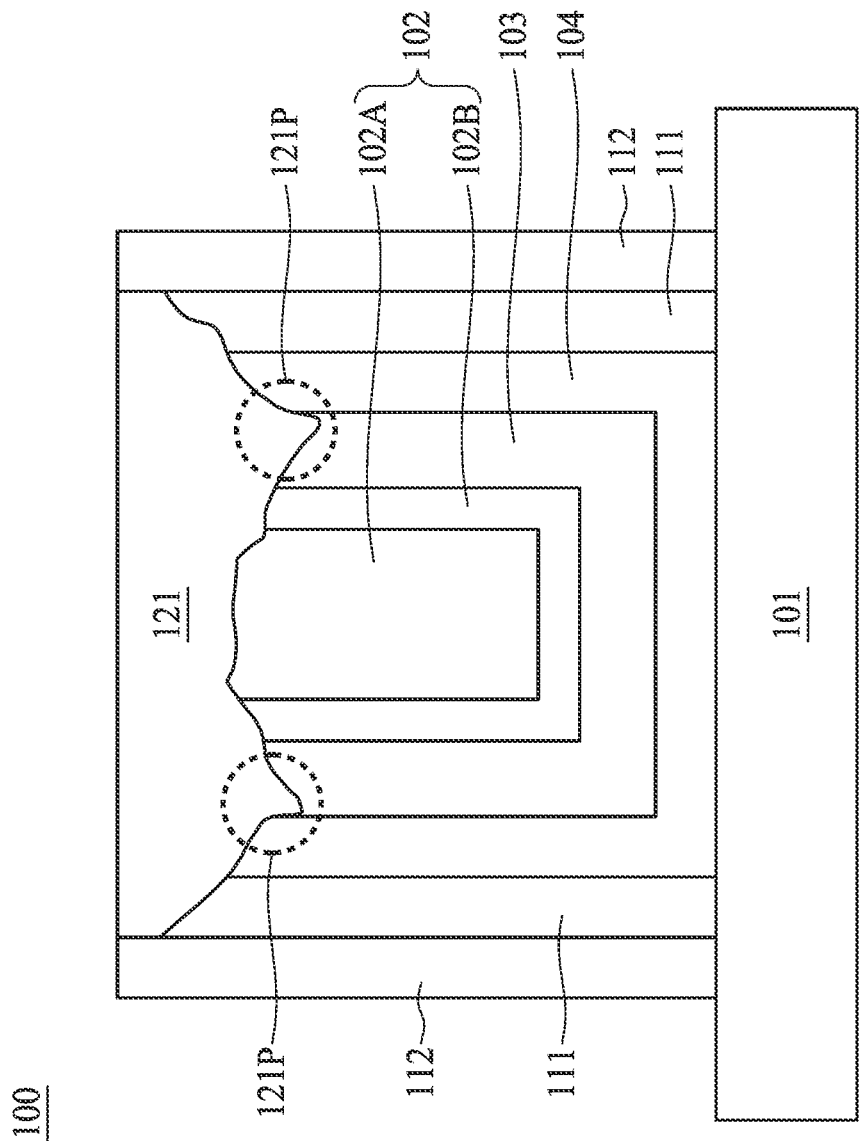

SEMICONDUCTOR DEVICE AND MANUFACTURING METHOD THEREOF

PRIORITY CLAIM AND CROSS-REFERENCE

This application claims the benefit of prior-filed provisional application No. 63/374,951, filed on Sep. 8, 2022, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency.

When a semiconductor device is scaled down through various technology nodes, device packing density and device performance are challenged by reliability issue. Particularly, an improved approach for effectively removing residues formed over a gate structure of a semiconductor device while alleviating over-etching issue is highly required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A' is a cross sectional view of a semiconductor device during intermediate stages of manufacturing operations along a line A2-A2 in FIG. 3A, in accordance with some embodiments of the present disclosure.

FIG. 3E is a cross sectional view of a semiconductor device during intermediate stages of manufacturing operations, according to some embodiments of the present disclosure.

DETAILED DESCRIPTION

Figure 1A:
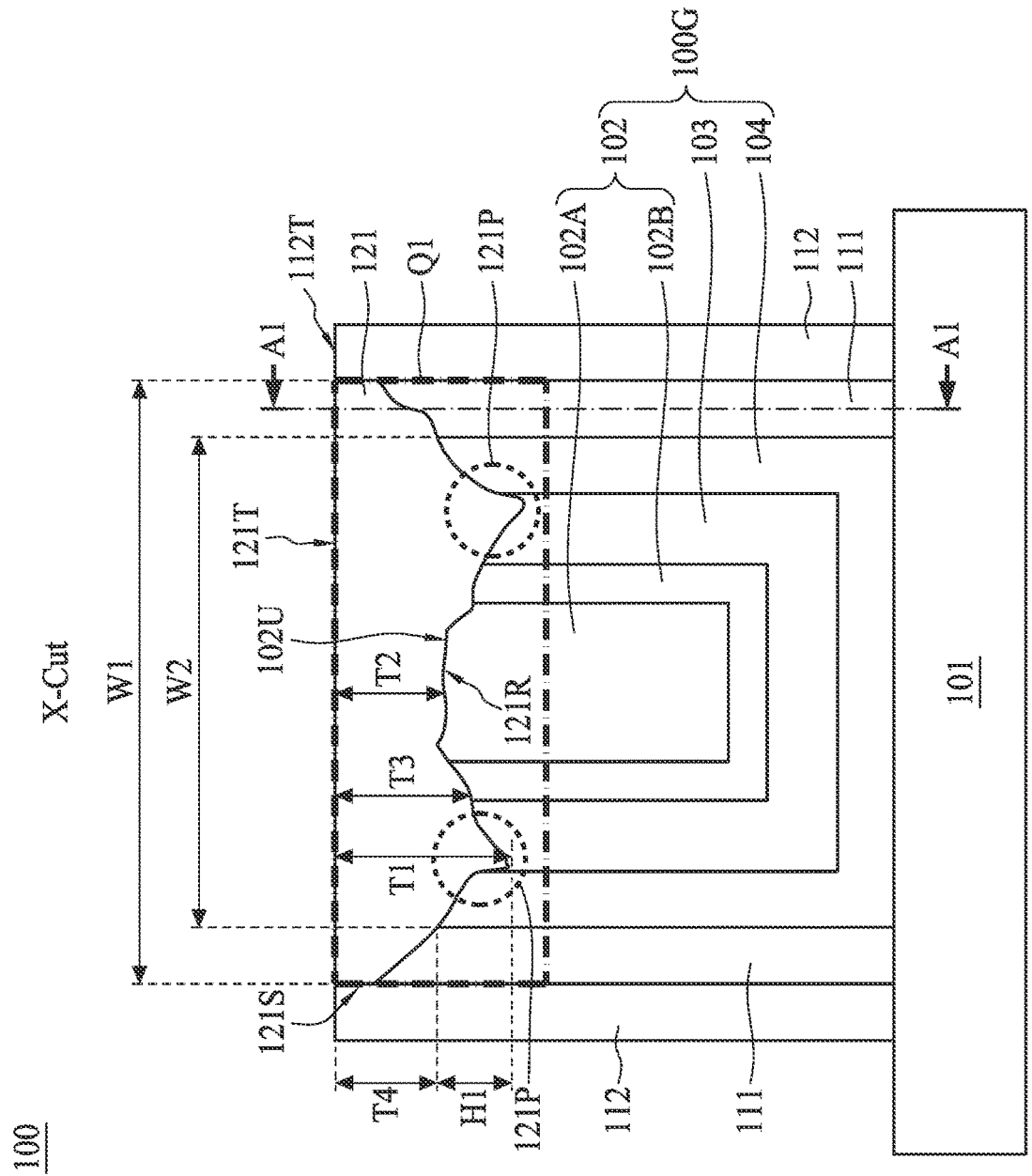
FIG. 1A is a cross sectional view of a semiconductor device, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The semiconductor integrated circuit (IC) industry has experienced exponential growth. Technological advances in IC materials and design have produced generations of ICs where each generation has smaller and more complex circuits than the previous generation. With the trend of scaling down the geometry size, it is more difficult to control the accuracy of etch back operation and cleaning operation.

When performing an etch back operation on a gate structure, residues may be generated. In order to alleviate the influence from the presence of residues regarding conductivity and reliability of overlying structures, a cleaning operation may be performed. However, conventional cleaning operations may cause over-etching or material loss issues, which further leads to issues such as poor reliability, non-uniform thicknesses of gate structures, and/or poorly formed overlying structures (such as capping layer) that is formed over the cleaned surface, et cetera.

The present disclosure recognizes the aforesaid issues, and provides suitable combination(s) of chemicals for etch back operation and corresponding cleaning operations for removing residues that may be caused by such etch back operation. By improving the efficiency of residue removal operations and alleviating over-etching/material loss issues, the aforementioned issues such as poor conductivity, poor reliability, non-uniform thicknesses of gate structures, and/or poorly formed overlying structures (such as capping layer) that is formed over the cleaned surface, may be alleviated.

Accordingly, a semiconductor structure will be discussed in FIG. 1A to FIG. 1C, and a method for forming a semiconductor structure will be discussed in FIG. 2 and FIG. 3A to FIG. 3E.

Figure 1B:
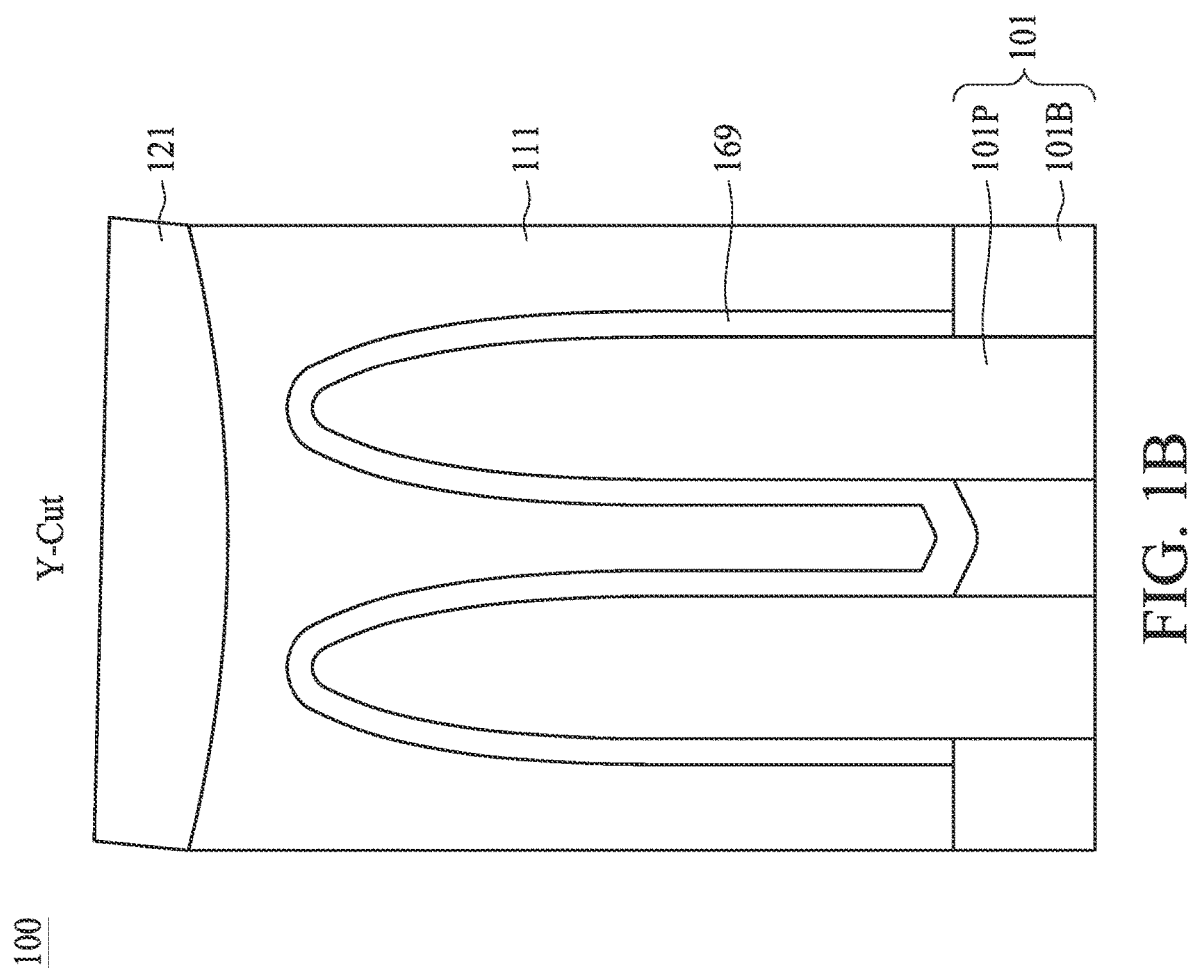
FIG. 1B is a cross sectional view of the semiconductor device along a line A1-A1 in FIG. 1A, in accordance with some embodiments of the present disclosure.

Referring to FIG. 1A and FIG. 1B, FIG. 1A is a cross sectional view of a semiconductor device, FIG. 1B is a cross sectional view of the semiconductor device along a line A1-A1 in FIG. 1A, in accordance with some embodiments of the present disclosure. A semiconductor structure 100 includes a substrate 101, an inner layer 102 over the substrate 100, a work function layer 103 over two sidewalls of the inner layer 102, a high-k layer 104 over two sidewalls of the work function layer 103, a low-k layer 111 over a sidewall of the high-k layer 104, and a dielectric layer 112 at least partially surrounding the high-k layer 104 in a lateral direction. The semiconductor structure 100 further includes a capping layer 121 over the inner layer 102, the work function layer 103, the high-k layer 104, and the low-k layer 111. In some embodiments, a portion of the work function layer 103 extends under a bottom layer of the inner layer 102, and a portion of the high-k layer 104 may be between the substrate 101 and a bottom surface of the work function layer 103. In some embodiments, the inner layer 102, the work function layer 103, and the high-k layer 104 are collectively referred to as a gate structure 100G. In some embodiments, the gate structure 100G is metal gate structure.

In some embodiments, the substrate 101 includes silicon. Alternatively, or additionally, the substrate includes another material, such as germanium, silicon carbide, gallium arsenide, gallium phosphide, gallium nitride, indium phosphide, indium arsenide, and/or indium antimonide, or, an alloy semiconductor, such as silicon germanium (SiGe), GaAsP, AlInAs, AlGaAs, GaInAs, GaInP, GaInAsP, one or more group III-V materials, one or more group II-VI materials, or combinations thereof. In some other embodiments, the substrate is a semiconductor-on-insulator substrate, such as a silicon-on-insulator (SOI) substrate, a silicon germanium-on-insulator (SGOI) substrate, or a germanium-on-insulator (GOI) substrate. In some embodiments, the substrate 101 includes a base portion 101B and one or more protrusions 101P. In some of the embodiments, the protrusions 101P can be a fin or a part of a fin. In some alternative embodiments, the protrusions 101P may have an elevated base portion and one or more protruding parts standing over the elevated base portion. In some of the embodiments, the semiconductor structure 100 may further include a liner 169 conforming to a profile of the protrusions 101P. In some embodiments, the liner 169 may include oxide or other suitable material. In some other embodiments, the liner 169 may be omitted.

In some embodiments, the inner layer 102 may include titanium nitride (TiN). In some embodiments, the inner layer 102 may be a multilayer structure, such as including a first layer 102A and a second layer 102B between the first layer 102A and the work function layer 103. In some embodiments, the first layer 102A may be a glue layer, and the first layer 102A may include TiN formed by using chemical vapor deposition (CVD). In some embodiments, the second layer 102B may include TiN formed by using a method different from the method for forming the first layer 102A, such as in-situ physical vapor deposition. In some of the embodiments, the work function layer 103 may include aluminum-doped titanium carbide (TiAlC). In some of the embodiments, the work function layer 103 may include multi-layer structure, such as having a plurality of work function metal layers. In some embodiments, a material of the capping layer 121 may be conductive material, such as tungsten (W).

Figure 1C:
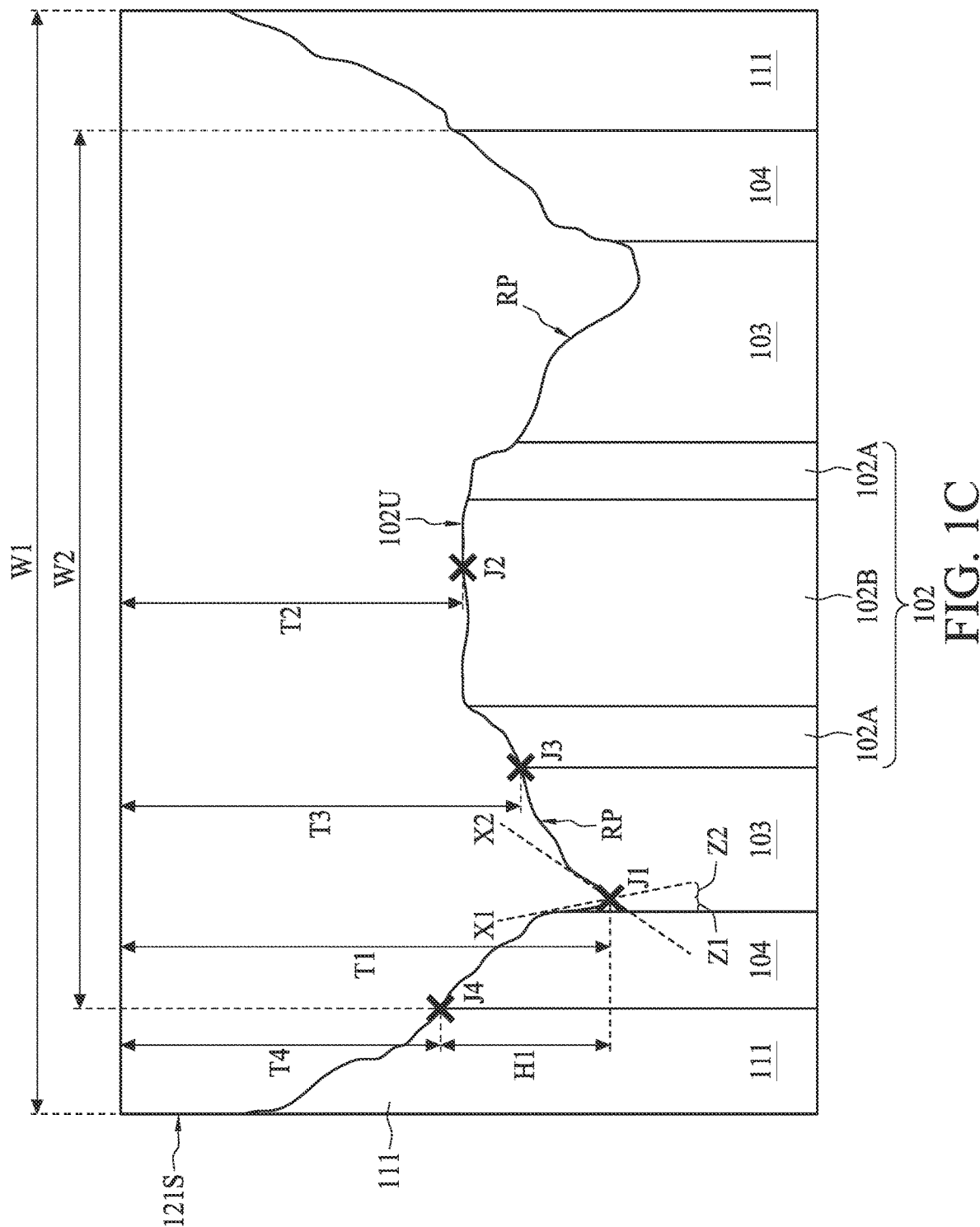
FIG. 1C is a partially enlarged fragmentary diagrammatic view of a portion Q1 of the semiconductor structure as shown in FIG. 1A, in accordance with some embodiments of the present disclosure.

Referring to FIG. 1A and FIG. 1C, FIG. 1C is a partially enlarged fragmentary diagrammatic view of a portion Q1 of the semiconductor structure as shown in FIG. 1A, in accordance with some embodiments of the present disclosure. In some embodiments, a top surface 121T of the capping layer 121 is coplanar with a top surface 112T of the dielectric layer 112. In some embodiments, a bottom of the capping layer 121 may have a non-uniform surface, for example, a pair of protrusions 121P and a recessed area 121R between the pair of protrusions 121P, wherein the recessed area 121R is recessed away from the substrate 101 (e.g. having an inverted U-shaped curve profile). In some embodiments, a sidewall of the capping layer 121 is in direct contact with a side of the dielectric layer 112.

In some embodiments, a first position J1 is at a lowermost position of the capping layer 121 (which may correspond to a tip of a protrusion 121P), which may be at a position over the work function layer 103, and may be relatively proximal to a boundary between the work function layer 103 and the high-k layer 104 in some examples.

In some embodiments, a second position J2 of the capping layer 121 is at the recessed area 121R of the bottom of the capping layer 121, which may correspond to an uppermost position of the inner layer 102, wherein the inner layer 102 has a protruding upper surface 102U. A third position J3 of the bottom of the capping layer 121 is at a junction of the capping layer 121, the work function layer 103, and the inner layer 102. The second position J2 is at a level above the third position J3, and the third position J3 is at a level above the first position J1.

A fourth position J4 of the bottom of the capping layer 121 is at a junction of the capping layer 121, the high-k layer 104, and the low-k layer 111. In some embodiments, the fourth position J4 is at a level above the third position J3.

From a top view perspective, the fourth position J4 is proximal to a peripheral portion of the capping layer 121, the second position J2 is proximal to a center portion of the capping layer 121, the first position J1 is between the second position J2 and the fourth position J4, and the third position J3 is between the first position J1 and the second position J2.

In some embodiments, a height difference H1 is between a vertical position of the first position J1 and a vertical position of the second position J2, wherein the height difference H1 is in a range from about 0.01 nm to about 3 nm. In some embodiments, if the height difference H1 is greater than 3 nm, the reliability of capping layer 121 formed by deposition techniques may have undesired reliability. Herein the height difference H1 corresponds to a height of the protrusion 121P.

The capping layer 121 has a first thickness T1 along a vertical direction over the first position J1, a second thickness T2 along a vertical direction over the second position J2, a third thickness T3 along a vertical direction over the third position J3, and a fourth thickness T4 along a vertical direction over the fourth position J4. Further, the capping layer 121 has a first width W1 at the top surface 121T of the capping layer 121, and has a second width W2 at a horizontal cross section proximal to the second position J2. A tolerable range of the first width W1 may depend on the application of the semiconductor structure 100. In some embodiments, the first width W1 is greater than the second width W2, and the first width W1 is greater than the first thickness T1. Further, the first thickness T1 is greater than the third thickness T3, and the third thickness T3 may be greater than the second thickness T2, and the third thickness T3 may be greater than the fourth thickness T4. Alternatively stated, a bottom of the capping layer 121 may have a bimodal profile (which has two peaks on two sides facing downward). Accordingly, each of two ends of the work function layer 103 has a recessed portion, wherein the work function layer 103 has two ends disposed on opposite sides of the inner layer 102. A portion of the work function layer 103 proximal to the inner layer 102 is above a portion of the work function layer 103 proximal to the high-k layer 104.

In addition, the capping layer 121 has a first section Z1 adjacent to the first position J1, and a second section Z2 adjacent to the first position J1. The first section Z1 is a local area relatively closer to a peripheral area of the capping layer 121, and is positioned between the first position J1 and the fourth position J4. The second section Z2 is a local area relatively closer to a center of the capping layer 121, and is positioned between the first position J1 and the third position J3. In some of the embodiments, an absolute value of a derivative X1 (an absolute value of local slope value) at the first section Z1 is greater than an absolute value of a derivative X2 (an absolute value of local slope value) at the second section Z2. In some of the embodiments, the value of a derivative X1 (a value of local slope value) at the first section Z1 times the value of a derivative X2 (a value of local slope value) at the second section Z2 is less than zero (i.e. one of them is positive and one of them is negative).

Figure 2:
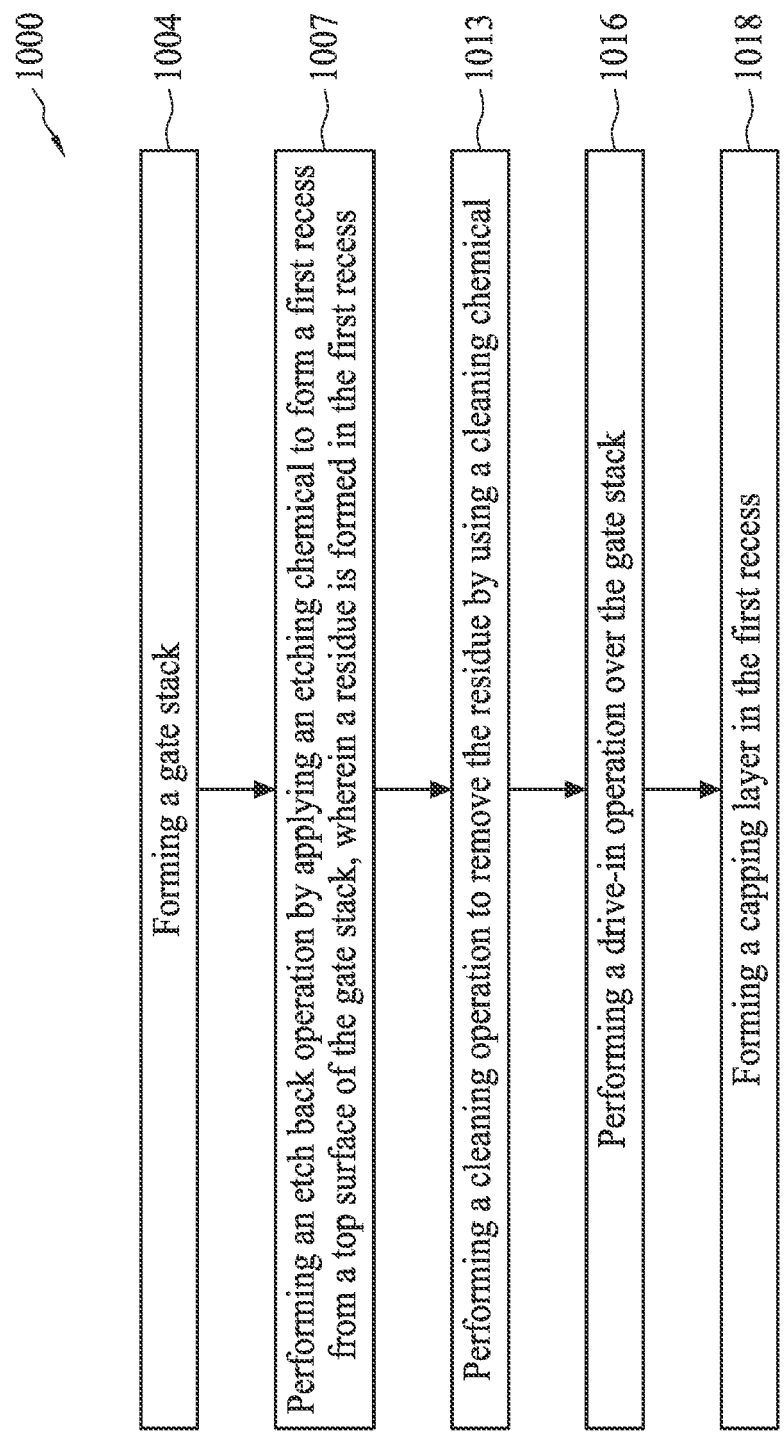
FIG. 2 shows a flow chart representing a method for fabricating a semiconductor device, in accordance with some embodiments of the present disclosure.

Referring to FIG. 2, FIG. 2 shows a flow chart representing a method for fabricating a semiconductor device, in accordance with some embodiments of the present disclosure. The method 1000 for fabricating a semiconductor device includes forming a gate stack (operation 1004, which can be referred to FIG. 3A), performing an etch back operation by applying an etching chemical to form a first recess from a top surface of the gate stack, wherein a residue is formed in the first recess (operation 1007, which can be referred to FIG. 3B), performing a cleaning operation to remove the residue by using a cleaning chemical (operation 1013, which can be referred to FIG. 3C), performing a drive-in operation over the gate stack (operation 1016, which can be referred to FIG. 3D), and forming a capping layer in the first recess (operation 1018, which can be referred to FIG. 3E).

Figure 3A:
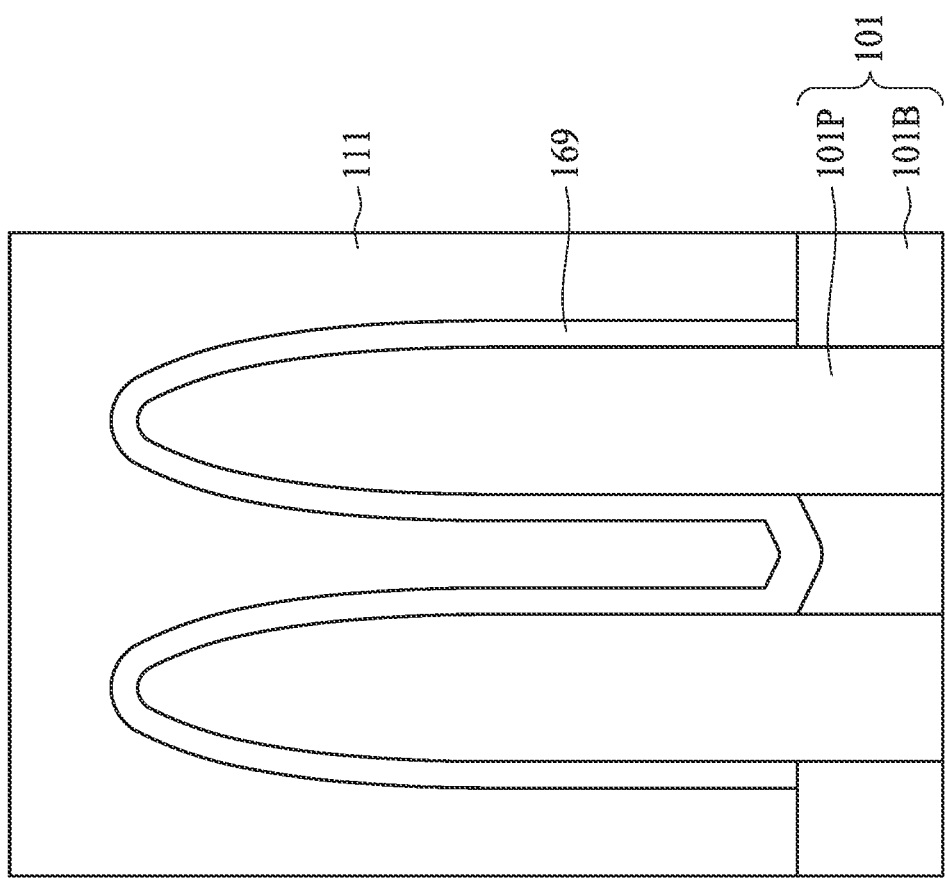
FIG. 3A is a cross sectional view of a semiconductor device during intermediate stages of manufacturing operations, according to some embodiments of the present disclosure.

Referring to FIG. 3A, FIG. 3A is a cross sectional view of a semiconductor device during intermediate stages of manufacturing operations, FIG. 3A' is a cross sectional view of a semiconductor device during intermediate stages of manufacturing operations along a line A2-A2 in FIG. 3A, according to some embodiments of the present disclosure. A substrate 101 is received. In some embodiments, the substrate 101 includes silicon. Alternatively, or additionally, the substrate includes another material, such as germanium, silicon carbide, gallium arsenide, gallium phosphide, gallium nitride, indium phosphide, indium arsenide, and/or indium antimonide, or, an alloy semiconductor, such as silicon germanium (SiGe), GaAsP, AlInAs, AlGaAs, GaInAs, GaInP, GaInAsP, one or more group III-V materials, one or more group II-VI materials, or combinations thereof. In some other embodiments, the substrate is a semiconductor-on-insulator substrate, such as a silicon-on-insulator (SOI) substrate, a silicon germanium-on-insulator (SGOI) substrate, or a germanium-on-insulator (GOI) substrate.

A dielectric layer 112 is formed over the substrate 101, and may be partially removed to form a sidewall. A liner 169 may be formed to conform to a profile of protrusions 101P of the substrate 101. A low-k layer 111 is selectively formed over the sidewall of the dielectric layer 112. Further, a gate stack 100G' is formed to conform to a sidewall profile of the low-k layer 111. The gate stack 100G' includes an inner layer 102 over the substrate 100, a work function layer 103 over two sidewalls of the inner layer 102, and a high-k layer 104 over two sidewalls of the work function layer 103. In some embodiments, a portion of the work function layer 103 extends under a bottom layer of the inner layer 102, and a portion of the high-k layer 104 may be between the substrate 101 and a bottom surface of the work function layer 103.

In some of the embodiments, the work function layer 103 may include aluminum-doped titanium carbide (TiAlC). In some embodiments, the work function layer 103 and the high-k layer 104 can be formed by deposition operations. Further, in some embodiments, the inner layer 102 may include titanium nitride (TiN), wherein the inner layer 102 may be a multilayer structure formed by multiple operations, such as forming a second layer 102B by using in-situ physical vapor deposition, followed by forming a first layer 102A by using chemical vapor deposition CVD, wherein the second layer 102B is between the first layer 102A and the work function layer 103. In some embodiments, a planarization operation (such as chemical mechanical planarization operation, CMP operation) can be performed to remove excessive materials of the gate stack 100G'.

Figure 3B:
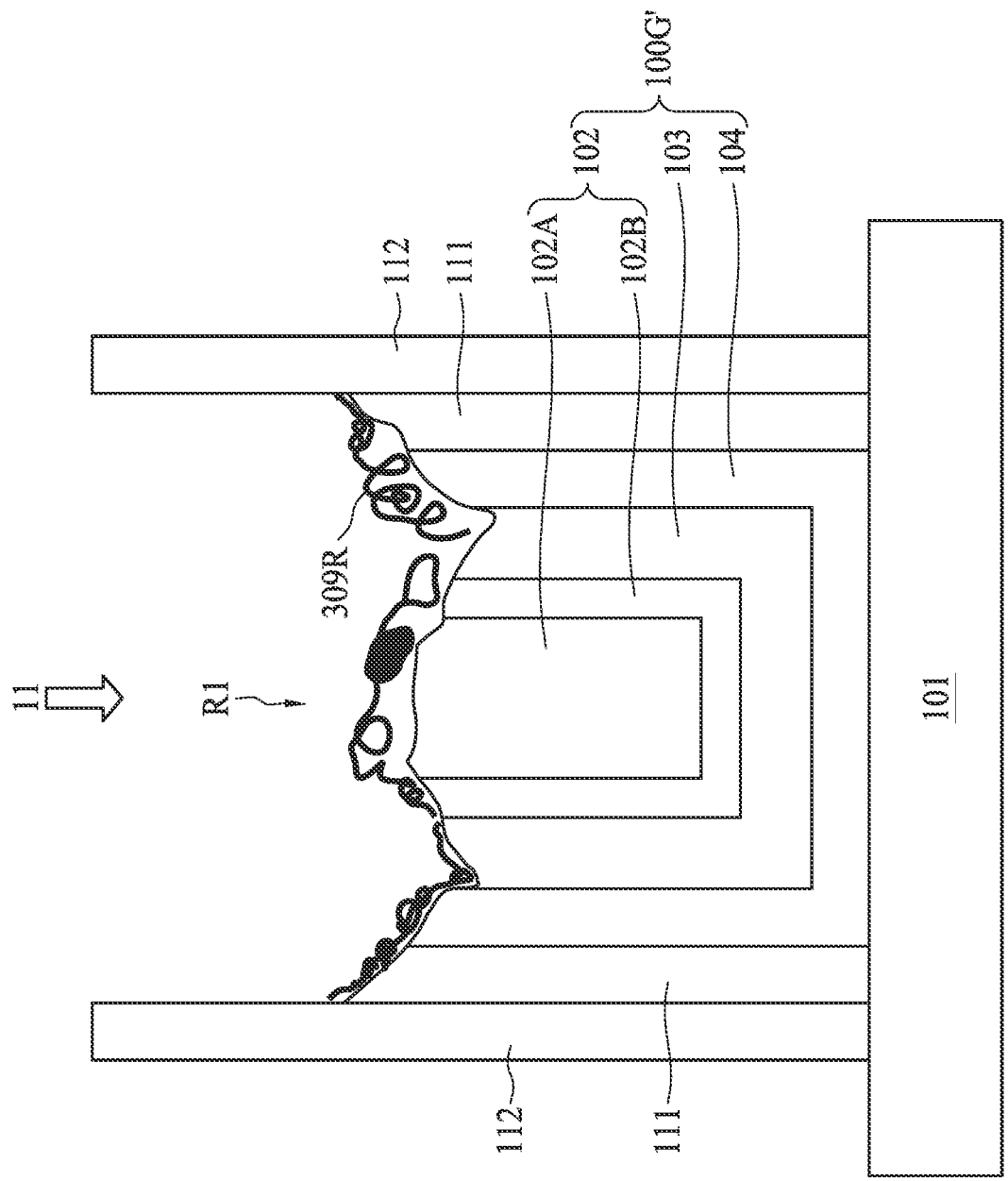
FIG. 3B is a cross sectional view of a semiconductor device during intermediate stages of manufacturing operations, according to some embodiments of the present disclosure.

Referring to FIG. 3B, FIG. 3B is a cross sectional view of a semiconductor device during intermediate stages of manufacturing operations, according to some embodiments of the present disclosure. An etch back operation 11 is performed to remove at least a portion of the gate stack 100G' from a top surface thereof, thereby forming a first recess R1. A portion of the low-k layer 111 may also be removed. The etch back operation 11 includes applying a boron trichloride gas ($BCl_3$) over the gate stack 100G'. In some embodiments, the boron trichloride gas can partially remove a portion of metal gate material used in the gate stack 100G'. However, residue 309R may be formed in the first recess R1 over the remained portion of the gate stack 100G', wherein the residue 309R is a byproduct that can be a negative factor for device performance, such as affecting electrical properties, hindering subsequent drive-in operation for improving device performance (which may further hinder the forming of capping layer 121 thereon, which will be discussed in FIG. 3E), and may further cause reliability issues. In some embodiments, the residue 309R covers a top surface of the low-k layer 111, a top surface of the work function layer 103, a top surface of the high-k layer 104, and/or a top surface of the inner layer 102. In some embodiments, a material of the residue 309R may include carbon compound and boron. In some embodiments, a material of the residue 309R may be boron-containing polymer (B-polymer).

Figure 3C:
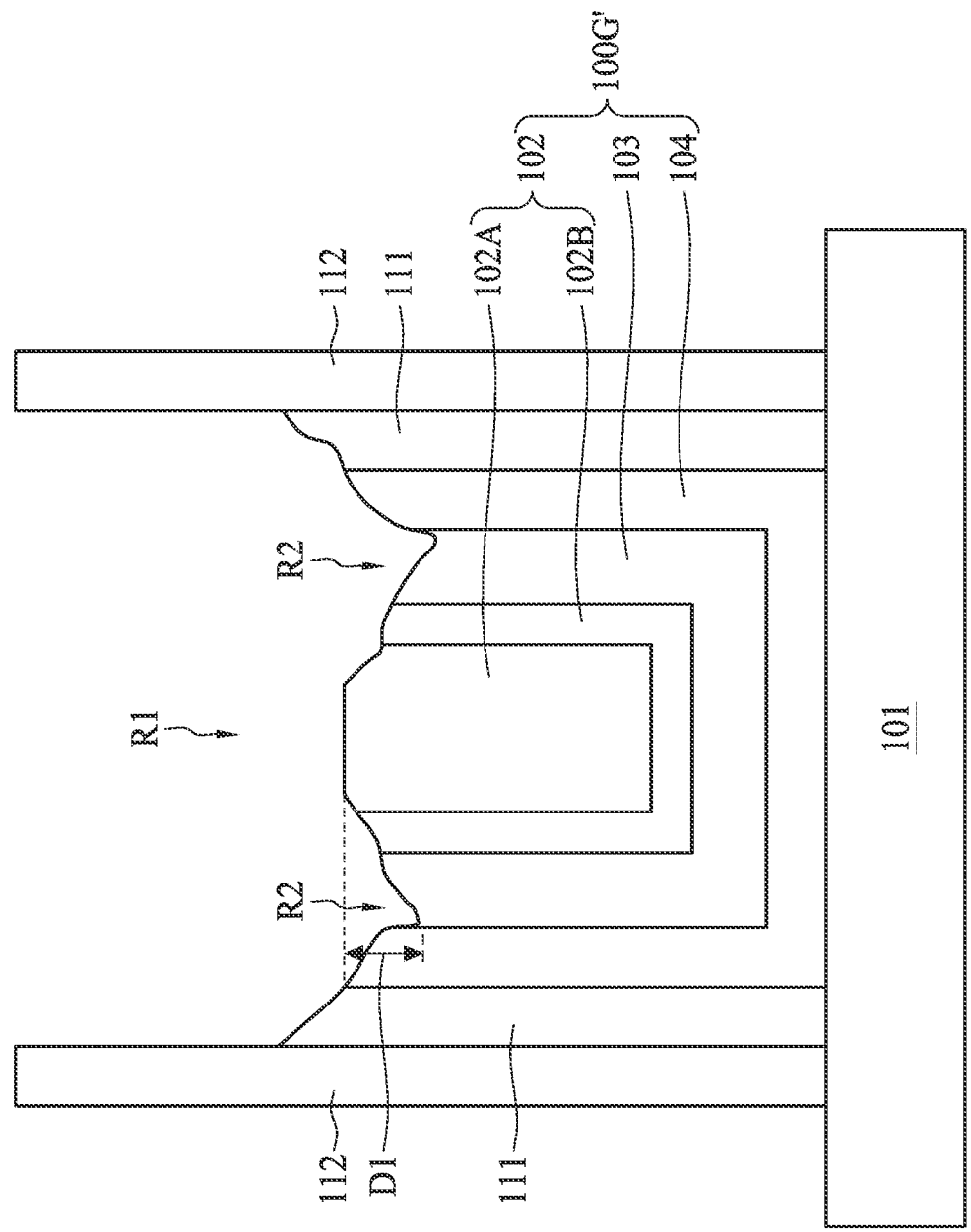
FIG. 3C is a cross sectional view of a semiconductor device during intermediate stages of manufacturing operations, according to some embodiments of the present disclosure.

Referring to FIG. 3C, FIG. 3C is a cross sectional view of a semiconductor device during intermediate stages of manufacturing operations, according to some embodiments of the present disclosure. A cleaning operation is performed to remove the residue 309R shown in FIG. 3B, wherein the cleaning operation includes applying a cleaning chemical including a first chemical over the residue 309R. The first chemical may have a pH value being in a range from about 5.0 to about 8.0. In some embodiments, the first chemical can be weak acid, which may have a pH value of the first chemical being in a range from about 5.0 to about 7.0. In some embodiments, the first chemical is weak base (a pH value of the first chemical is in a range from about 7.0 to about 8.0). The cleaning operation may further include applying a second chemical over the residue 309R after applying the first chemical. The second chemical may have a pH value being in a range from about 5.0 to about 8.0. A combination of the first chemical and the second chemical may have a pH value being in a range from about 5.0 to about 8.0.

In some embodiments, the first chemical includes hydrogen peroxide ($H_2O_2$) and deionized water (DIW). A weight percentage of DIW in the first chemical is greater than a weight percentage of $H_2O_2$ in the first chemical. In some embodiments, a ratio of a composition $H_2O_2$ in the first chemical over a composition of DIW in the first chemical may be in a range from about 1:2 to about 1:25. In some embodiments, a temperature of the DIW can be in a range from about 25° C. to about 70° C. A first duration of applying the first chemical may be in a range from about 0.5 minute to about 5 minutes.

In some embodiments, the second chemical can be ozone ($O_3$), which may have a concentration in a range from about 0.5 ppm to about 10 ppm. In some embodiments, a temperature of the ozone can be in a range from about 25° C. to about 70° C. A second duration of applying the second chemical may be shorter than the first duration, such as from 1 second to about 30 seconds. In some embodiments, ozone has an etch rate on the residue 309R greater than an etch rate of the first chemical (such as $H_2O_2$ and DIW) on the residue 309R. However, in order to control a material loss of tungsten in other device areas, the second duration can be shorter than the first duration. As discussed subsequently, by performing the aforesaid cleaning operation, the removal of residue 309R may be effectively improved (e.g. less residue 309R is remained or even completely removed), while controlling the material loss of the gate stack 100G', especially on work function layer 103, which may be made of aluminum-doped titanium carbide (TiAlC).

In a comparative embodiment of applying a cleaning chemical with ammonium hydroxide ($NH_4OH$) or having a pH value greater than 9, the cleaning chemical may etch the gate stack 100G' and cause material loss, especially etching on the work function layer 103 which may be made of TiAlC. An etch rate of strong base chemical (or $NH_4OH$ containing chemical) over the TiAlC is greater than desired speed, thus, by the time when boron-containing polymer residue is completely consumed by such strong base chemical (or $NH_4OH$ containing chemical), a deep void (with a depth greater than 3 nm and a sharper profile) may already be formed from a top surface of the work function layer 103. Such issues further leads to issues such as poor reliability, non-uniformed size of gate structures, and/or poorly formed overlying structures (such as capping layer 121 as will be discussed in FIG. 3E) that is formed over the cleaned surface. In some embodiments, the aforesaid first chemical and the second chemical used in the cleaning operation is substantially free from including $NH_4OH$.

In another comparative embodiments of using strong acid for cleaning operation, the high-k layer 104 may suffer from substantial material loss, which would induce reliability issues.

Figure 3D:
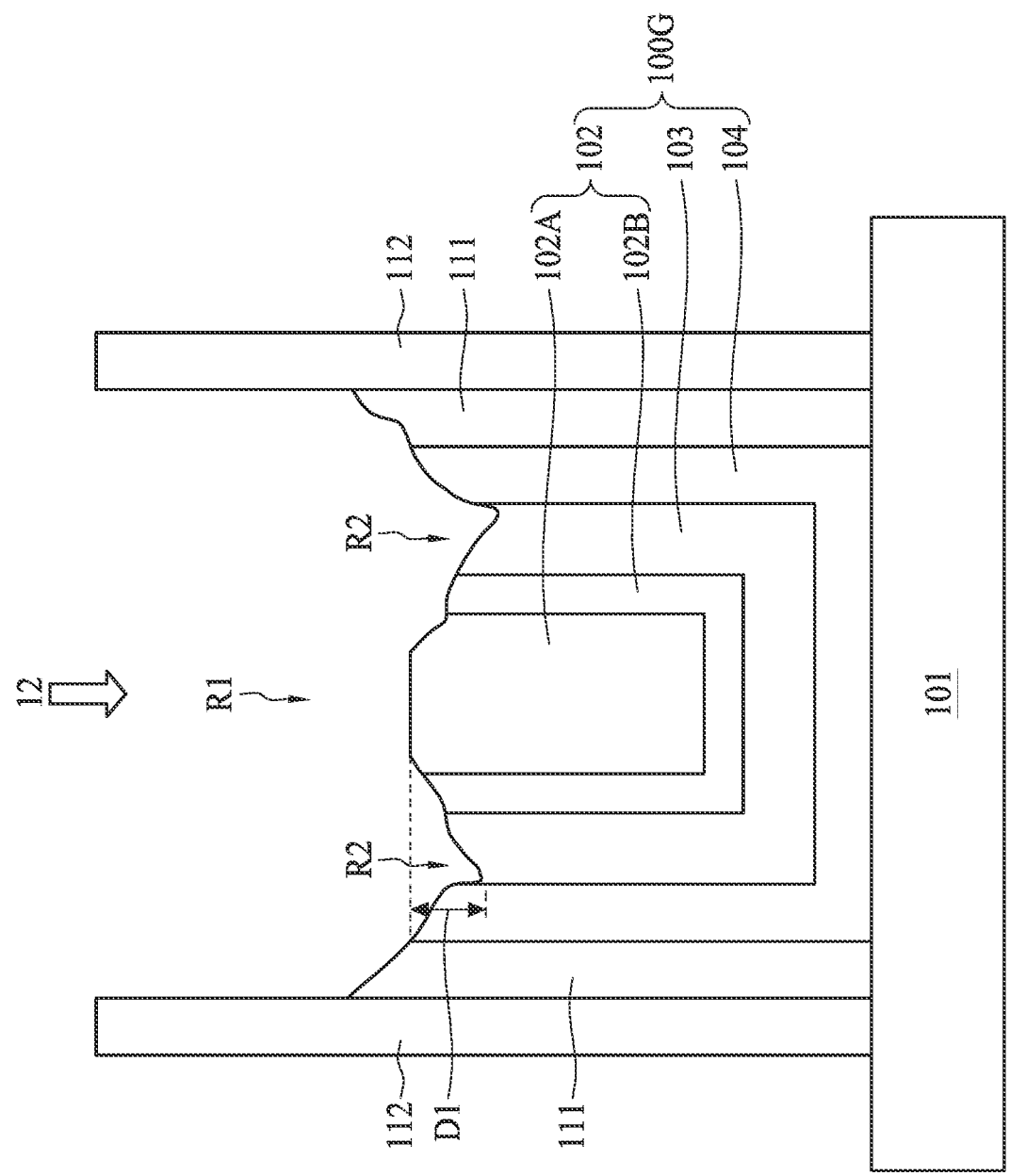
FIG. 3D is a cross sectional view of a semiconductor device during intermediate stages of manufacturing operations, according to some embodiments of the present disclosure.

In another comparative embodiments of merely using water for cleaning operation, water may not effectively remove boron-containing polymer residue, thereby hindering the subsequent drive-in operation discussed in FIG. 3D.

In contrast, the combination of first chemical and the second chemical may have a pH value staying in a range from about 5.0 to about 8.0 during the cleaning operation (which in some embodiments, includes applying the first chemical and the second chemical in sequence). Particularly, the first chemical (such as $H_2O_2$ and DIW) and the second chemical (ozone) may be less harmful over the work function layer 103 which may be made of aluminum-doped titanium carbide (TiAlC) during the removal of residue 309R, thereby alleviating material loss of the work function layer 103.

In some embodiments, by using the aforesaid first chemical and the second chemical in the cleaning operation, a depth D1 of the second recesses R2 formed from the top surface of the work function layer 103 after performing cleaning operation is in a range from about 0.01 nm to about 3 nm. A depth D1 greater than 3 nm may lead to issues such as poor reliability, non-uniformed size of gate structures, and/or poorly formed overlying structures (such as capping layer 121 as will be discussed in FIG. 3E) that is formed over the cleaned surface. In some embodiments, a portion of the inner layer 102 is above an uppermost surface of the work function layer 103. In some embodiments, a lowermost position of the second recesses R2 is at a position proximal to a boundary between the work function layer 103 and the high-k layer 104.

Referring to FIG. 3D, FIG. 3D is a cross sectional view of a semiconductor device during intermediate stages of manufacturing operations, according to some embodiments of the present disclosure. After performing the aforesaid cleaning operation, a drive-in operation 12 may be performed over the cleaned surface of the gate stack 100G' (shown in FIG. 3C), thereby forming a gate structure 100G. In some embodiments, the drive-in operation 12 is a fluoride drive-in operation that may improve device performance and lower resistivity of the gate structure 100G. The drive-in operation 12 may be performed under an elevated temperature, such as having a temperature being in a range from about 100° C. to about 500° C. If the operation temperature is greater than the aforesaid range or less than the aforesaid range, the effectiveness of improving device performance and lowering resistivity of the gate structure 100G may be inadequate.

Further, the effective removal of residue 309R as discussed in FIG. 3C may improve the effectiveness of drive-in operation.

Referring to FIG. 3E, FIG. 3E is a cross sectional view of a semiconductor device during intermediate stages of manufacturing operations, according to some embodiments of the present disclosure. A capping layer 121 is formed over the gate structure 100G and in the first recess R1 and the second recesses R2. The capping layer 121 may be made of tungsten (W), which can be formed by deposition operations such as CVD, PVD, et cetera. A planarization operation (such as CMP) may be performed to remove excessive portion of the capping layer 121, thereby forming a semiconductor structure 100. The capping layer 121 conforms to a profile of the first recess R1 and the second recesses R2, thereby a bottom of the capping layer 121 has a non-uniform profile as discussed in FIG. 1A to FIG. 1C, wherein the details of such profile can be referred thereto. Particularly, the pair of protrusions 121P are formed in the second recesses R2 shown in FIG. 3D.

In the cases when the removal of residue 309R is ineffective, the drive-in operation discussed in FIG. 3D may be hindered. Furthermore, the forming of the capping layer 121 over the gate structure 100G would be hindered as well. Particularly, the growth of deposited tungsten may be abnormal and thereby failing to comply with device requirement in terms of uniformity, reliability, et cetera.

On the other hand, in the cases when using strong acid, strong base, or certain chemical that may cause the material loss of work function layer 103 (such as NH$_4$OH containing chemical), deep voids (having a depth greater than 3 nm) may be formed on the top surface of the work function layer 103. In such situation, the reliability of the capping layer 121 formed thereon may be decreased, and the uniformity of each capping layers 121 over a substrate 101 may be undesirable. Peelings may occur when some of the capping layer 121 have poor reliability.

The present disclosure provides a semiconductor structure will be discussed in FIG. 1A to FIG. 1C, and a method for forming a semiconductor structure will be discussed in FIG. 2 and FIG. 3A to FIG. 3E.

Particularly, the method for forming a semiconductor structure provided by the present disclosure includes forming a gate stack, performing an etch back operation over the gate stack, wherein residue made of boron-containing polymer may be generated, removing the residue by performing a cleaning operation discussed in FIG. 3C (which uses cleaning chemical(s) having a pH value in a range from about 5.0 to about 8.0, such as applying H$_2$O$_2$ and DIW followed by applying ozone), performing a fluoride drive-in operation over the gate stack as discussed in FIG. 3D, and forming a capping layer 121 after the drive-in operation as discussed in FIG. 3E.

By using the aforesaid combination of cleaning chemicals, the boron-containing polymer residue caused by the etch back operation can be effectively removed. Further, the material loss of work function layer 103 can be substantially alleviated. As discussed in FIG. 1A to FIG. 1C and FIG. 3D, the second recesses R2 recessed from a top surface of the work function layer 103 may be controlled to be in a range from about 0.01 nm to about 3 nm, therefore the pair of protrusions 121P at a bottom of the capping layer 121 also has a height being in a range from about 0.01 nm to about 3 nm.

In addition, the effective removal of residue 309R as discussed in FIG. 3C may improve the effectiveness of drive-in operation discussed in FIG. 3D, wherein the drive-in operation can improve the device performance and lower resistivity of the gate structure 100G. Furthermore, the effectiveness of removing the residue 309R as well as the effectiveness of drive-in operation are key factors of the reliability of the capping layer 121, as well as the device performance and reliability of the semiconductor structure 100.

Some embodiments of the present disclosure provide a semiconductor structure, including a substrate, a gate structure over the substrate, including a work function layer over the substrate, a dielectric layer at least partially surrounding the gate structure, and a capping layer over the gate structure, wherein a bottom of the capping layer includes at least one protrusion protruding toward the substrate.

Some embodiments of the present disclosure provide a method for fabricating a semiconductor structure, including forming a gate stack over a substrate, performing an etch back operation by applying an etching chemical to form a first recess from a top surface of the gate stack, wherein a residue is formed in the first recess, and performing a cleaning operation to remove at least a portion of the residue by using a first chemical, wherein a pH value of the first chemical is in a range from 5.0 to 8.0.

Some embodiments of the present disclosure provide a method for fabricating a semiconductor structure, including forming a gate stack over a substrate, performing an etch back operation by applying an etching chemical to form a first recess from a top surface of the gate stack, and performing a cleaning operation after the etch back operation, including applying hydrogen peroxide in the first recess.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   a substrate;
   a first dielectric layer over the substrate; and
   a gate structure over the substrate, comprising:
      a work function layer over the substrate;
      a second dielectric layer at least partially surrounding the work function layer and laterally surrounded by the first dielectric layer; and a capping layer over the work function layer and the second dielectric layer, wherein the capping layer comprises at least one protrusion protruding toward the substrate, wherein the capping layer comprises a top surface coplanar with a top surface of the first dielectric layer, wherein the capping layer is formed of a conductive material with a homogeneous composition across portions of the capping layer over the work function layer and the second dielectric layer.

2. The semiconductor structure of claim 1, wherein a height of the at least one protrusion of the capping layer is in a range from 0.01 nm to 3 nm.

3. The semiconductor structure of claim 1, wherein the capping layer comprises a first protrusion and a second protrusion apart from the first protrusion.

4. The semiconductor structure of claim 1, wherein a peak of the at least one protrusion is at a position above the work function layer.

5. The semiconductor structure of claim 1, wherein the capping layer is made of tungsten.

6. The semiconductor structure of claim 1, wherein the work function layer is in direct contact with the capping layer.

7. The semiconductor structure of claim 1, wherein:
the gate structure further comprises an inner layer lining at an inner sidewall of the work function layer,
a first portion of the capping layer directly above the work function layer has a first thickness, and
a second portion of the capping layer directly above the inner layer has a second thickness, wherein the first thickness is greater than the second thickness.

8. The semiconductor structure of claim 7, wherein an entire top width of the capping layer is greater than the first thickness.

9. A method for fabricating a semiconductor structure, comprising:
forming a gate stack over a substrate;
performing an etch back operation by applying an etching chemical to form a first recess from a top surface of the gate stack, wherein a residue is formed in the first recess;
performing a cleaning operation to remove at least a portion of the residue by using a first chemical, wherein a pH value of the first chemical is in a range from 5.0 to 8.0; and
performing a fluoride drive-in operation on the gate stack.

10. The method of claim 9, wherein the first chemical comprises hydrogen peroxide and deionized water.

11. The method of claim 9, wherein the cleaning operation further comprises applying ozone over the gate stack.

12. The method of claim 9, wherein the fluoride drive-in operation is operated at a temperature in a range from 100° C. to 500° C.

13. The method of claim 9, further comprising forming a capping layer in the first recess.

14. The method of claim 9, wherein the etching chemical comprises a boron trichloride gas, and the residue comprises boron-containing polymer.

15. The method of claim 9, wherein the first chemical is free from $NH_4OH$.

16. The method of claim 9, wherein the forming of the gate stack comprises depositing a work function layer, wherein the first recess is formed on the work function layer.

17. A method for fabricating a semiconductor structure, comprising:
forming a gate stack over a substrate;
performing an etch back operation by applying an etching chemical to form a first recess from a top surface of the gate stack;
performing a cleaning operation after the etch back operation, comprising applying hydrogen peroxide in the first recess; and
performing a fluoride drive-in operation on the gate stack.

18. The method of claim 17, wherein the cleaning operation further comprises applying ozone after applying the hydrogen peroxide.

19. The method of claim 17, further comprising performing a drive-in operation on the gate stack after performing the cleaning operation.

20. The method of claim 17, further comprising forming a capping layer in the first recess.

* * * * *